(12) United States Patent
Giduturi et al.

(10) Patent No.: US 7,313,019 B2
(45) Date of Patent: Dec. 25, 2007

(54) STEP VOLTAGE GENERATION

(75) Inventors: Hari Giduturi, Folsom, CA (US); Kerry D. Tedrow, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 324 days.

(21) Appl. No.: 11/018,130

(22) Filed: Dec. 21, 2004

(65) Prior Publication Data

US 2006/0132114 A1    Jun. 22, 2006

(51) Int. Cl.
G11C 11/34 (2006.01)
G11C 16/04 (2006.01)

(52) U.S. Cl. .................. 365/185.03; 365/185.23; 365/185.09; 365/185.2; 365/185.19

(58) Field of Classification Search ............... 365/185
See application file for complete search history.

(56) References Cited

U.S. PATENT DOCUMENTS

| | | | |
|---|---|---|---|
| 5,172,338 A | 12/1992 | Mehrotra et al. | |
| 5,339,272 A | 8/1994 | Tedrow et al. | |
| 5,608,669 A * | 3/1997 | Mi et al. | 365/185.03 |
| 5,892,727 A | 4/1999 | Nakagawa | |
| 6,009,040 A * | 12/1999 | Choi et al. | 365/233 |
| 6,014,330 A | 1/2000 | Endoh et al. | |
| 6,118,701 A * | 9/2000 | Uekubo | 365/185.2 |
| 6,181,599 B1 | 1/2001 | Gongwer | |
| 6,333,885 B1 * | 12/2001 | Bedarida et al. | 365/208 |
| 6,462,988 B1 | 10/2002 | Harari | |
| 6,586,985 B1 * | 7/2003 | Romas et al. | 327/525 |
| 6,603,702 B2 | 8/2003 | Kojima | |
| 6,731,540 B2 | 5/2004 | Lee et al. | |
| 7,054,197 B2 * | 5/2006 | Vimercati | 365/185.18 |
| 7,092,295 B2 | 8/2006 | Iwase et al. | |
| 7,106,626 B2 | 9/2006 | Goldman et al. | |
| 7,116,597 B1 | 10/2006 | Goldman et al. | |
| 7,176,751 B2 * | 2/2007 | Giduturi et al. | 327/540 |
| 2002/0053944 A1 | 5/2002 | Brass et al. | |
| 2002/0105835 A1 | 8/2002 | Pasotti et al. | |
| 2004/0136237 A1 | 7/2004 | Banks | |
| 2005/0265073 A1 | 12/2005 | Chae et al. | |
| 2007/0076473 A1 * | 4/2007 | Giduturi | 365/185.03 |
| 2007/0171708 A1 | 7/2007 | Tedrow et al. | |

FOREIGN PATENT DOCUMENTS

| | | |
|---|---|---|
| EP | 1071094 | 1/2001 |
| EP | 1071094 A1 | 1/2001 |
| EP | 1467377 | 10/2004 |
| GB | 2332766 | 6/1999 |
| WO | WO-2007078885 A2 | 7/2007 |

* cited by examiner

*Primary Examiner*—Amir Zarabian
*Assistant Examiner*—Michael Weinberg
(74) *Attorney, Agent, or Firm*—LeMoine Patent Services, PLLC; Dana B. Lemoine

(57) ABSTRACT

A step voltage generator includes multiple trainable voltage references. Each of the trimmable voltage references uses a flash cell with a variable threshold voltage and a feedback loop to trim a reference voltage. The threshold voltage of the flash cell can be programmed to affect the reference voltage.

22 Claims, 11 Drawing Sheets

MODIFY THRESHOLD VOLTAGES OF A PLURALITY OF FLOATING GATE TRANSISTORS IN A PLURALITY OF VOLTAGE REFERENCE CIRCUITS TO AFFECT THE OUTPUT VOLTAGES OF THE VOLTAGE REFERENCE CIRCUITS, WHEREIN THE OUTPUT VOLTAGES OF THE VOLTAGE REFERENCE CIRCUITS REPRESENT THRESHOLDS FOR MULTI-LEVEL CELL FLASH MEMORIES ⎯ 1010

PACKAGE AN INTEGRATED CIRCUIT DIE THAT INCLUDES THE PLURALITY OF VOLTAGE REFERENCE CIRCUITS ⎯ 1020

STEP VOLTAGE GENERATION

FIELD

The present invention relates generally to electronic circuits, and more specifically to voltage reference circuits.

BACKGROUND

Some voltage reference circuits generate an output voltage that is referenced to a value of a circuit element such as a resistor. Varying the output voltage may be performed by varying the value of the circuit element. A resistor may be placed on an integrated circuit die, but these types of resistors tend to be imprecise. A precision resistor may be placed outside an integrated circuit, but this may take up space.

SUMMARY OF THE INVENTION

In accordance with one embodiment, a multi-level cell flash memory device includes an array of flash memory cells coupled to wordlines and a step voltage generator coupled to the wordlines, the step voltage generator including a voltage reference, a plurality of conditioning circuits having amplifiers and feedback networks, and a multiplexer to receive reference voltages from the conditioning circuits.

In accordance with another embodiment, a multi-level cell flash memory device includes an array of flash memory cells coupled to wordlines and at least one step voltage generator coupled to the wordlines, wherein the at least one step voltage generator includes a plurality of reference voltage generators and a multiplexer, and wherein each of the plurality of reference voltage generators includes a floating gate transistor having a programmable threshold voltage, and a feedback circuit to produce a reference voltage that depends on the programmable threshold voltage.

In accordance with another embodiment, a multi-level cell flash memory device includes an array of flash memory cells coupled to wordlines and at least one step voltage generator coupled to the wordlines, wherein the at least one step voltage generator includes a plurality of reference voltage generators, each reference voltage generator including a transistor with a programmable threshold voltage and a feedback circuit, to generate reference voltages that vary based on programmed threshold voltages of the transistors and a multiplexing circuit to multiplex the reference voltages onto the wordlines.

BRIEF DESCRIPTION OF THE DRAWINGS

FIG. 10 shows a flowchart in accordance with various embodiments of the present invention.

DESCRIPTION OF EMBODIMENTS

Figure 1:
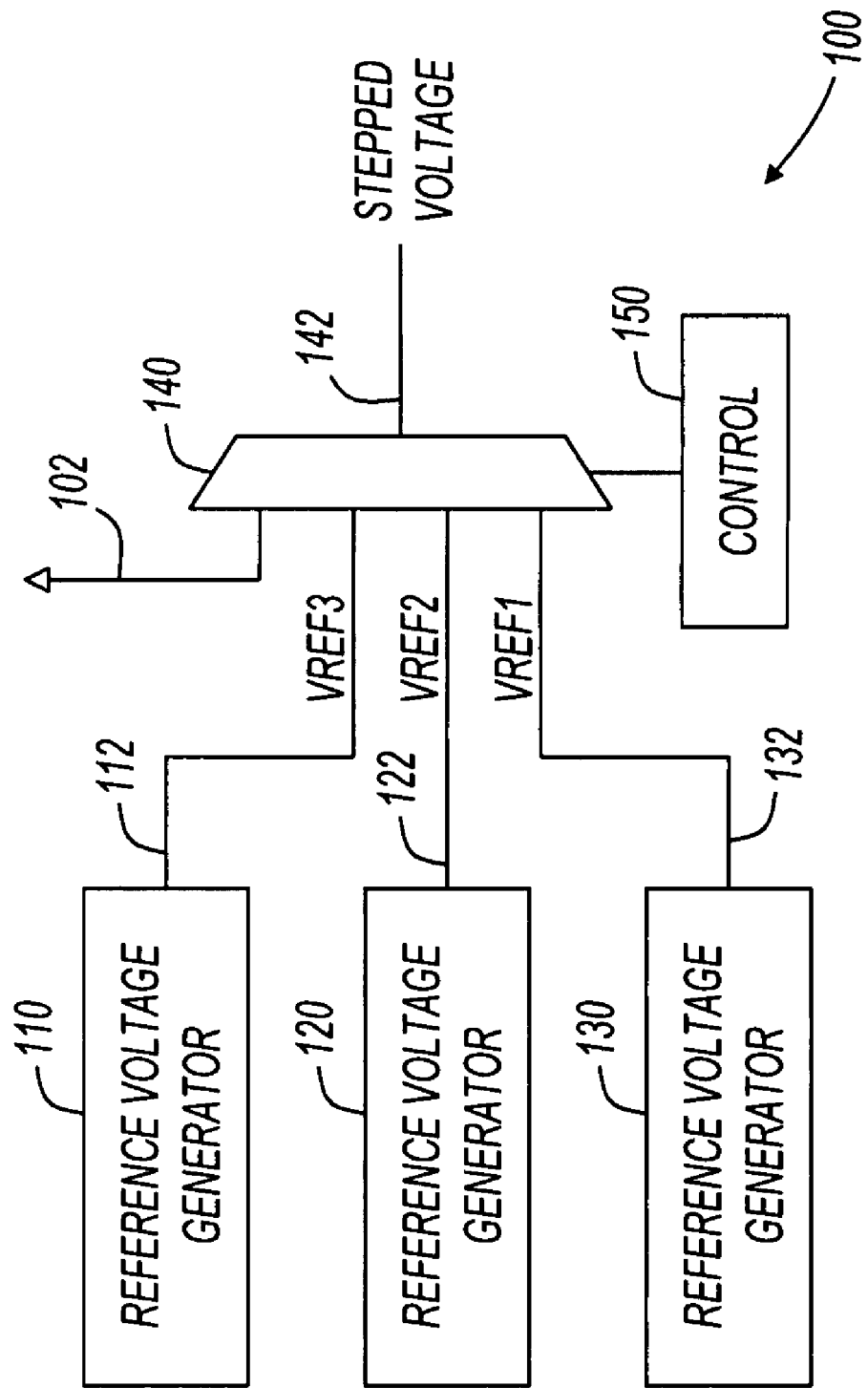
FIGS. 1 and 2 show step voltage generators.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 3:
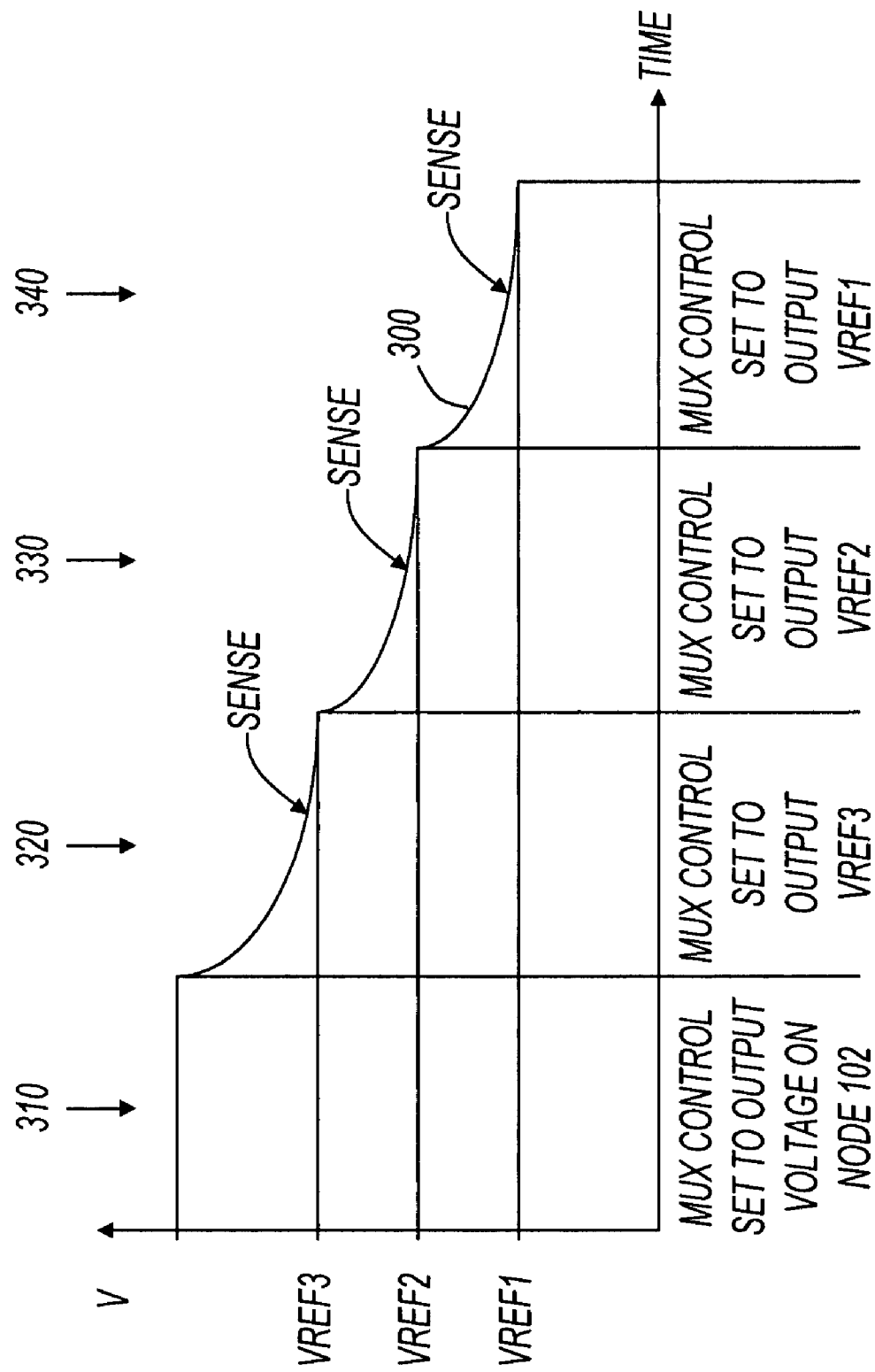
FIG. 3 shows a stepped voltage waveform.

FIG. 1 shows a step voltage generator. Step voltage generator 100 includes reference voltage generators 110, 120, and 130, multiplexer 140, and control block 150. In operation, reference voltage generators 110, 120, and 130 generate three reference voltages on nodes 112, 122, and 132, respectively. Multiplexer 140 receives the reference voltages on nodes 112, 122, and 132, and also receives a voltage on node 102. In response to control signals from control block 150, multiplexer 140 switches voltages onto node 142 one at a time as a stepped voltage waveform. An example stepped voltage waveform is described below with reference to FIG. 3. In some embodiments, a step-down waveform is generated by step voltage generator 100. FIG. 3 shows an example of a step-down waveform. In other embodiments, a step-up waveform is generated by step voltage generator 100. Depending on the switching order of multiplexer 140, and also depending on the voltage on node 102 and the values of $V_{REF1}$, $V_{REF2}$, and $V_{REF3}$, a step-up, step-down or any other type of step waveform may be generated. In general, any arbitrary step waveform may be generated using step voltage generator 100.

In some embodiments, reference voltage generators 110, 120, and 130 are "trimmable" reference voltage generators. For example, each of reference voltage generators 110, 120, and 130 may include voltage reference circuits with floating gate transistors having programmable threshold voltages, that when programmed to various values, "trim" the reference voltages. The floating gate transistors are used as reference devices, in that the output voltages generated by the reference voltage generators are a function of the programmed threshold voltages. Example embodiments of voltage reference circuits that utilize floating gate transistors as reference devices are described below with reference to later figures.

Figure 2:
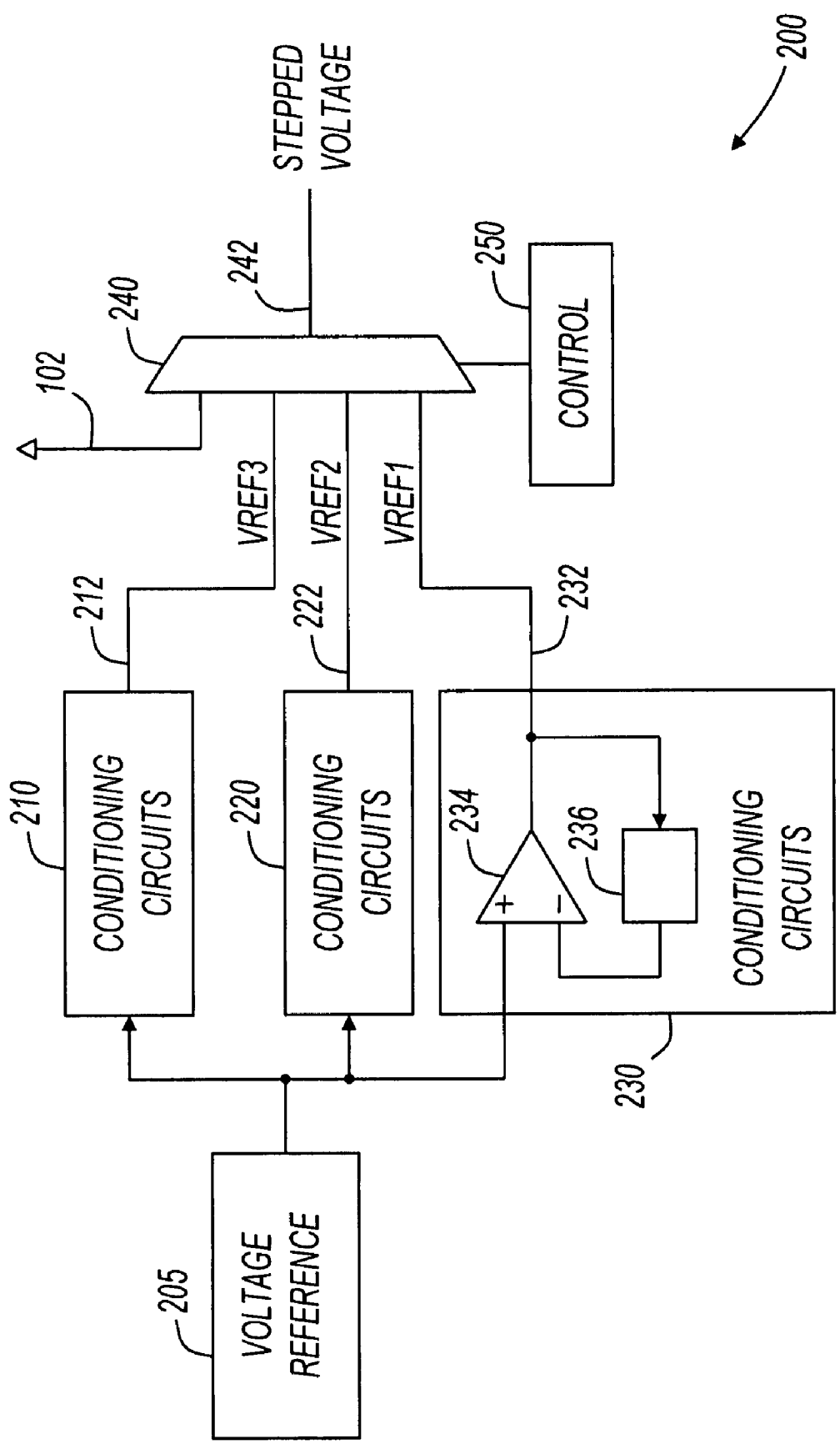

FIG. 2 shows a step voltage generator. Step voltage generator 200 includes bandgap voltage reference 205, conditioning circuits 210, 220, and 230, multiplexer 240, and control block 250. In operation, bandgap voltage reference 205 provides a reference voltage to conditioning circuits 210, 220, and 230, and the conditioning circuits generate three reference voltages on nodes 212, 222, and 232, respectively. Multiplexer 240 receives the reference voltages on nodes 212, 222, and 232, and also receives a voltage on node 102. In response to control signals from control block 250, multiplexer 240 switches voltages onto node 242 one at a time as a stepped voltage waveform. In some embodiments, a step-down waveform is generated by step voltage generator 200, and in other embodiments, a step-up waveform is generated by step voltage generator 200. Depending on the switching order of multiplexer 240, and also depending on the voltage on node 102 and the values of $V_{REF1}$, $V_{REF2}$, and $V_{REF3}$, a step-up, step-down or any other type of step waveform may be generated. In general, any arbitrary step waveform may be generated using step voltage generator 200.

Voltage reference 205 may be any type of voltage reference capable of providing a voltage to conditioning circuits 210, 220, and 230. For example, voltage reference 205 may be a bandgap reference that utilizes characteristics of the bandgap energy of a semiconductor material (e.g., silicon) to provide a stable reference voltage. Further, conditioning circuits 210, 220, and 230 may be any type of circuit capable of producing a reference voltage. For example, conditioning circuits 230 includes amplifier 234 and feedback network 236. In some embodiments, the combination of amplifier 234 and feedback network 236 produce $V_{REF1}$ on node 232 from the voltage provided by voltage reference 205. Other example conditioning circuits are described below with reference to later figures.

In some embodiments, step voltage generator 100 (FIG. 1) or step voltage generator 200 (FIG. 2) may be used to drive wordlines of flash memory cells in multi-level cell (MLC) memory devices. For example, a step voltage generator may be used to drive wordlines of flash memory cells that can have two or more states corresponding to different threshold voltage levels. To read the cell, the wordline may be driven with a stepped waveform, and multiple sensing operations may take place. Although step voltage generators 100 and 200 output voltages from three reference voltage generators, any number of reference voltage generators may be included in a step voltage generator without departing from the scope of the present invention.

FIG. 3 shows a stepped voltage waveform. Stepped voltage waveform 300 steps from a higher voltage value down to a lower voltage. Stepped voltage waveform 300 may be generated by a step voltage generator such as step voltage generator 100 (FIG. 1) or step voltage generator 200 (FIG. 2). For example, at 310, stepped voltage waveform 300 corresponds to multiplexer 140 or 240 selecting the voltage on node 102 to be output; at 320, stepped voltage waveform 300 corresponds to multiplexer 140 or 240 selecting $V_{REF3}$ to be output; at 330, stepped voltage waveform 300 corresponds to multiplexer 140 or 240 selecting $V_{REF2}$ to be output; and at 340, stepped voltage waveform 300 corresponds to multiplexer 140 or 240 selecting $V_{REF1}$ to be output.

When stepped voltage waveform 300 is used to drive a wordline in a memory for multi-level sensing, a sensing operation may occur as the voltage settles to a pre-determined value within areas 320, 330, and 340. For example, in some embodiments, a sensing operation may take place when the stepped waveform is within a few percent of its final value (e.g., $V_{REF3}$, $V_{REF2}$, or $V_{REF1}$). As explained further below, the values of $V_{REF3}$, $V_{REF2}$, and $V_{REF1}$ may be trimmed by programming a threshold voltage of a floating gate transistor within each of voltage reference generators within the step voltage generator.

Figure 4:
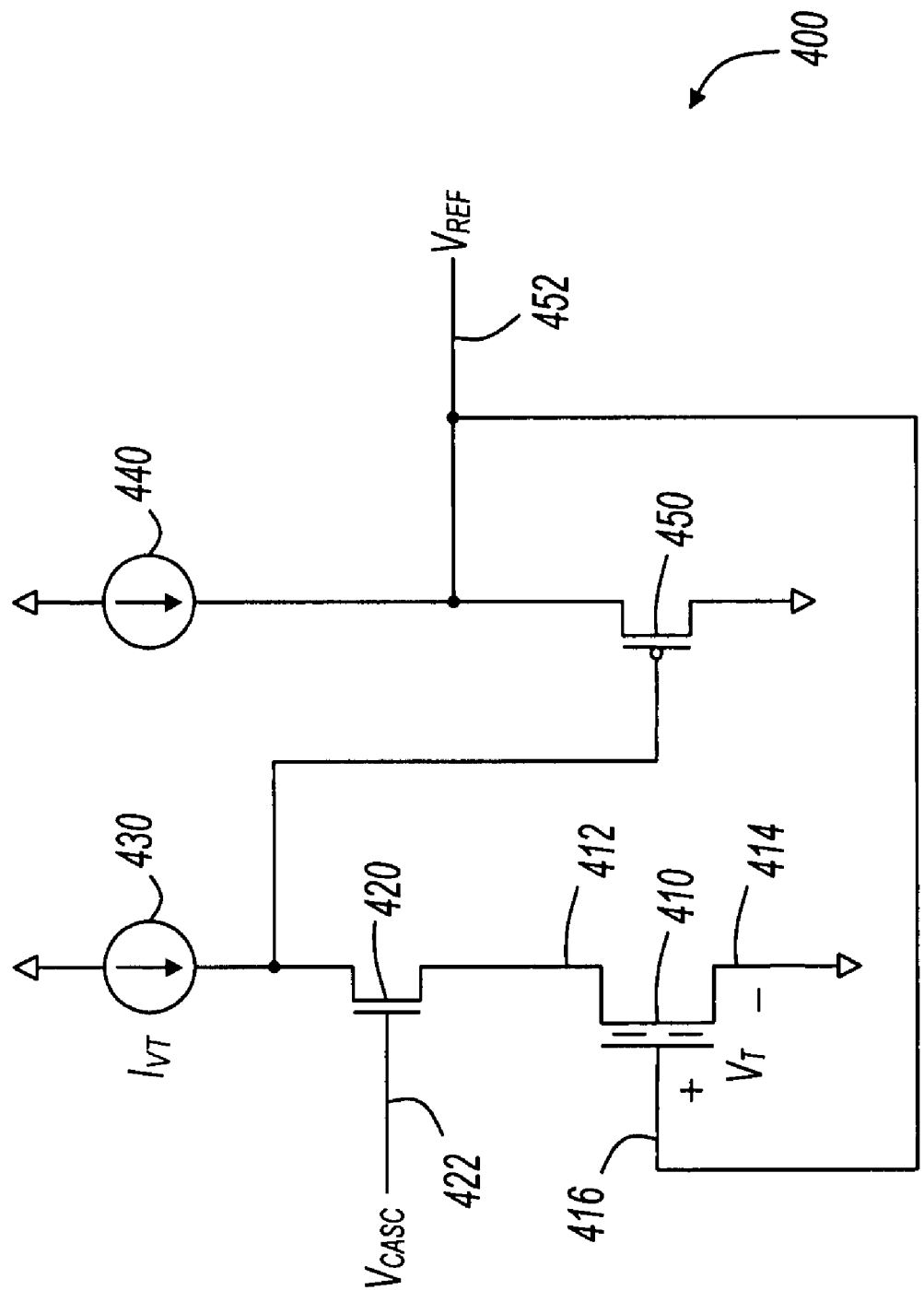
FIG. 4 shows a voltage reference circuit with a feedback loop.

FIG. 4 shows a voltage reference circuit with a feedback loop. Voltage reference circuit 400 may be utilized within one or more reference voltage generators within a step voltage generator. For example, voltage reference circuit 400 may be included in reference voltage generator 110 in step voltage generator 100 (FIG. 1). Further, additional instantiations of voltage reference circuit 400 may be included in reference voltage generators 120 and 130 in step voltage generator 100. Also for example, voltage reference circuit 400 may be included in conditioning circuits 210 in step voltage generator 200 (FIG. 2). Further, additional instantiations of voltage reference circuit 400 may be included in conditioning circuits 220 and 230 in step voltage generator 200.

Voltage reference circuit 400 includes flash cell 410, isolated gate transistors 420 and 450, and current sources 430 and 440. Flash cell 410, isolated gate transistor 420, and current source 430 form a first stage; and isolated gate transistor 450 and current source 440 form a second stage. The second stage is coupled to the first stage as part of a feedback loop in a unity gain configuration.

Flash cell 410 is an example of a floating gate transistor having a variable threshold voltage ($V_T$). The threshold voltage of flash cell 410 may be modified by changing the amount of charge stored on the floating gate of flash cell 410. This may also be referred to as "programming" flash cell 410. Flash cell 410 may be programmed with programming circuitry (not shown) useful for programming floating gate transistors.

As used herein, the term "threshold voltage current" refers to the current that flows through a transistor when a voltage of substantially $V_T$ appears across the control terminals of the transistor, and the drain voltage is set to a nominal value. For example, the threshold voltage current of an NMOS transistor is equal to the drain-to-source current of the transistor when the gate-to-source voltage is substantially $V_T$. Also for example, the threshold voltage current ($I_{VT}$) of flash cell 410 flows from drain 412 to source 414 when the gate-to-source voltage between nodes 416 and 414 is substantially $V_T$.

Isolated gate transistor 420 is coupled between current source 430 and flash cell 410 in a cascode configuration. The gate node of transistor 420 is coupled to node 422 which has a voltage of $V_{CASC}$. $V_{CASC}$ is a voltage that is chosen to provide a suitable drain voltage on drain node 412 of flash cell 410. For example, in some embodiments, $V_{CASC}$ is chosen to provide a drain voltage of between about 0.7 volts and 1.2 volts. In some embodiments, $V_{CASC}$ is set once and is static thereafter. For example, $V_{CASC}$ may be provided by an on-chip voltage reference that remains static. In other embodiments, $V_{CASC}$ may be provided by a variable voltage reference circuit, so that the drain voltage on flash cell 410 may be modified.

Transistor 450 is coupled as a "source follower," which provides low output impedance to drive relatively large capacitive loads easily. The gate node of transistor 450 is coupled to the drain node of transistor 420 to receive a voltage that is influenced by flash cell 410. The drain node of transistor 420 is coupled to a power supply node (which may be "ground"), and the source node of transistor 450 is coupled to provide the output voltate $V_{REF}$ on node 452. In some embodiments, source follower transistor 450 is operated in the sub-threshold region where the transconductance ($g_m$) of the transistor is proportional to the drain current. This operation is in contrast to operation in the inversion saturation region where $g_m$ is proportional to the square-root of the drain current. In other words, in the sub-threshold region of operation, the value of $g_m$ is higher for a given drain current. The output impedance of the source follower stage is equal to $1/g_m$ of transistor 450, and may be adjusted by choosing the size of source follower transistor 450 and the drain current provided by current source 440.

Current source 430 provides a current $I_{VT}$ substantially equal to the threshold voltage current of flash cell 410. The operation of the feedback loop in combination with current sourced by current source 430 forces the gate-to-source voltage of flash cell 410 to be substantially $V_T$, which may vary based on how flash cell 410 has been programmed. The output voltage $V_{REF}$ is provided by the voltage on gate node 416, which is substantially equal to $V_T$. By programming flash cell 410 to have a different $V_T$, $V_{REF}$ may be modified.

In some embodiments, flash cell 410 is programmed to perform offset voltage correction. Voltage offsets of the various circuit components may be trimmed out of the circuit by modifying the threshold voltage of flash cell 410 until the desired output voltage is obtained.

In some embodiments, flash cell 410 is manufactured with dimensions larger than the minimum dimensions available in a particular manufacturing process. For example, the width of the gate area, the length of the gate area, or both, may be larger than the minimum dimension available. In some embodiments, the gate area of flash cell 410 is a few times larger than the minimum area possible. In other embodiments, the gate area of flash cell 410 is over one hundred times larger than the minimum area possible. In still further embodiments, the gate area of flash cell 410 is over one thousand times larger than the minimum gate area. A larger gate area may provide greater $V_T$ stability over time, in part because a larger amount of charge may be stored on a larger floating gate within flash cell 410.

Figure 5:
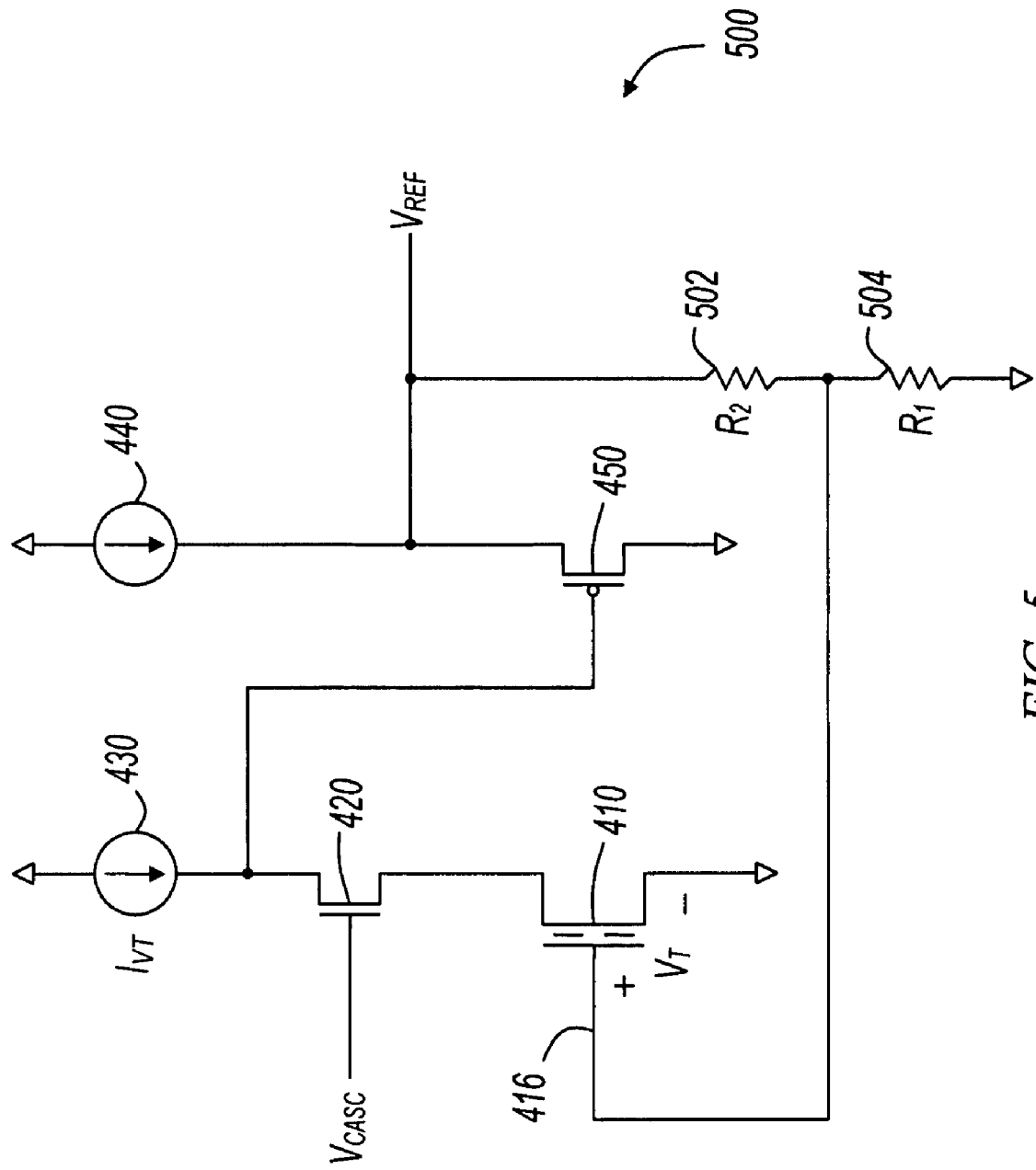
FIG. 5 shows a voltage reference circuit with a voltage divider in a feedback loop.

FIG. 5 shows a voltage reference circuit with a voltage divider in a feedback loop. Voltage reference circuit 500 may be utilized within one or more reference voltage generators within a step voltage generator. For example, voltage reference circuit 500 may be included in reference voltage generator 110 in step voltage generator 100 (FIG. 1). Further, additional instantiations of voltage reference circuit 500 may be included in reference voltage generators 120 and 130 in step voltage generator 100.

Voltage reference circuit 500 includes flash cell 410, transistors 420 and 450, and current sources 430 and 440, all of which are described above with reference to FIG. 4. Voltage reference circuit 500 also includes resistors 502 and 504 having resistance values of $R_2$ and $R_1$, respectively. Resistors 502 and 504 form a resistive voltage divider in the feedback path between the output voltage $V_{REF}$ and the voltage $V_T$ on gate 416 of flash cell 410.

In embodiments represented by FIG. 5, $V_{REF}$ is equal to $V_T[(R_2+R_1)/R_1]$. The values of $R_2$ and $R_1$ may be chosen to scale $V_{REF}$ in any manner. In some embodiments, $R_2$ and $R_1$ are manufactured as on-chip resistors, such as diffusion, poly, or metal resistors, and the final output voltage is adjusted by trimming the programmed value of flash cell 410. Although a resistive voltage divider is shown in FIG. 5, this is not a limitation of the present invention. For example, in some embodiments, a capacitive voltage divider may be utilized. Also for example, a transistor-based divider may be used.

Figure 6:
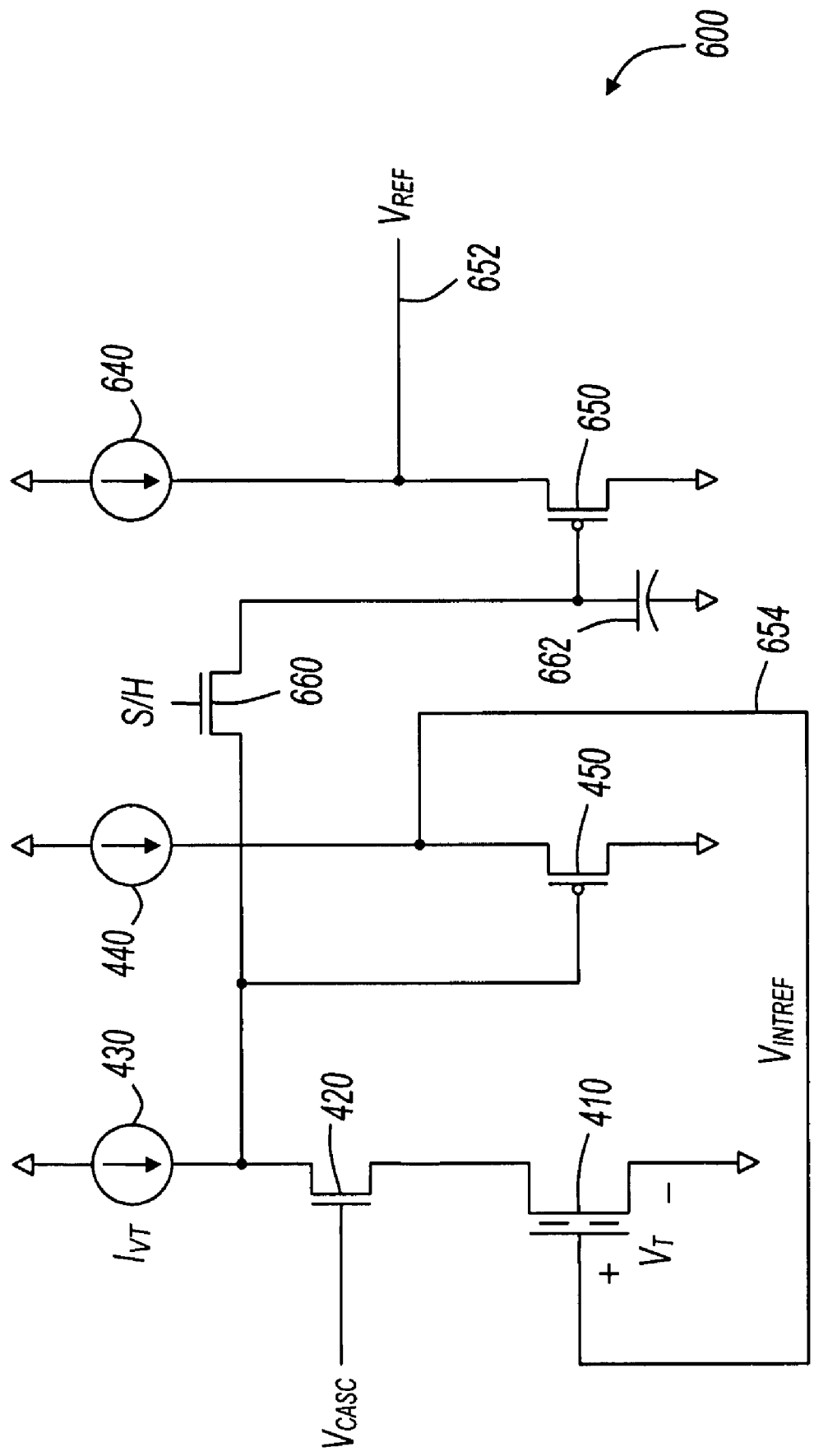
FIGS. 6 and 7 show voltage reference circuits with open loop output circuits.

FIG. 6 shows a voltage reference circuit with an open loop output circuit. Voltage reference circuit 600 may be utilized within one or more reference voltage generators within a step voltage generator. For example, voltage reference circuit 600 may be included in reference voltage generator 110 in step voltage generator 100 (FIG. 1). Further, additional instantiations of voltage reference circuit 600 may be included in reference voltage generators 120 and 130 in step voltage generator 100.

Voltage reference circuit 600 includes flash cell 410, transistors 420 and 450, and current sources 430 and 440, all of which are described above with reference to FIG. 4. Voltage reference circuit 600 also includes a sample and hold circuit that includes transistor 660 and capacitor 662, and voltage reference circuit 600 also includes transistor 650 coupled in a source follower arrangement with current source 640 providing a source-to-drain current for transistor 650. Current source 640 and transistor 650 form a third stage coupled to provide an open loop output response. The gate node of transistor 650 is coupled to the gate node of transistor 450 through transistor 660. The drain node of transistor 650 is coupled to provide the reference voltage $V_{REF}$ on node 652 at the junction between current source 640 and transistor 650.

P-channel source-followers may be advantageously used to pull down the output node much faster when the initial voltage is higher than the nominal voltage. With the gate voltage fixed, the initial source-to-gate voltage of the source follower transistor will be higher than its nominal value and it can pull down the output voltage very strongly to the nominal value.

In some embodiments, current sources 440 and 640 are designed to source the same current value. Also in some embodiments, transistors 450 and 650 are matched devices that exhibit substantially the same operating characteristics. In embodiments represented by FIG. 6, transistors 450 and 650 are driven by a common gate voltage. In these embodiments, if transistors 450 and 650 are matched, and the two load currents provided by current sources 440 and 640 are matched, the output voltage $V_{REF}$ will be substantially equal to internal loop voltage $V_{INTREF}$ on node 654, which is in turn substantially equal to the threshold voltage $V_T$ of flash cell 410. With the gate voltage of transistor 650 held fixed by the closed loop configuration, transistor 650 may respond very fast and may be able to pull down any voltage on output node 652 to the $V_{REF}$ voltage value without disrupting the operation of the feedback loop.

As shown in FIG. 6, a sample and hold circuit is coupled between the gate node of transistor 450 and the gate node of transistor 650. The sample and hold circuit includes transistor 660 and capacitor 662. Transistor 660 is turned on and off by the operation of the signal "S/H." When transistor 660 is on, capacitor 662 is charged to a static voltage, and the operation of voltage reference circuit 600 is as described above. When transistor 660 is turned off, the voltage on the gate of transistor 650 is sampled and held, and the output response remains unchanged for as long as the voltage on capacitor 662 remains unchanged. In some embodiments, when transistor 660 is off, current sources 430 and 440 may be turned off to save power, while providing a substantially constant output voltage $V_{REF}$. The sample and hold circuit may operate with regular frequency depending on the leakage tolerance of the circuit node that includes the gate of transistor 650. In some embodiments, the sample and hold circuit is omitted.

In some embodiments, $V_{REF}$ on node 652 may be a voltage that is different from the threshold voltage of flash cell 410. For example, a voltage divider may be included in the feedback path as shown in FIG. 5. Further, transistors 450 and 650 may be unmatched, or current sources 440 and 640 may be unmatched, or both. By intentionally mismatching current sources or transistors, $V_{REF}$ may be an voltage offset from $V_T$.

Figure 7:
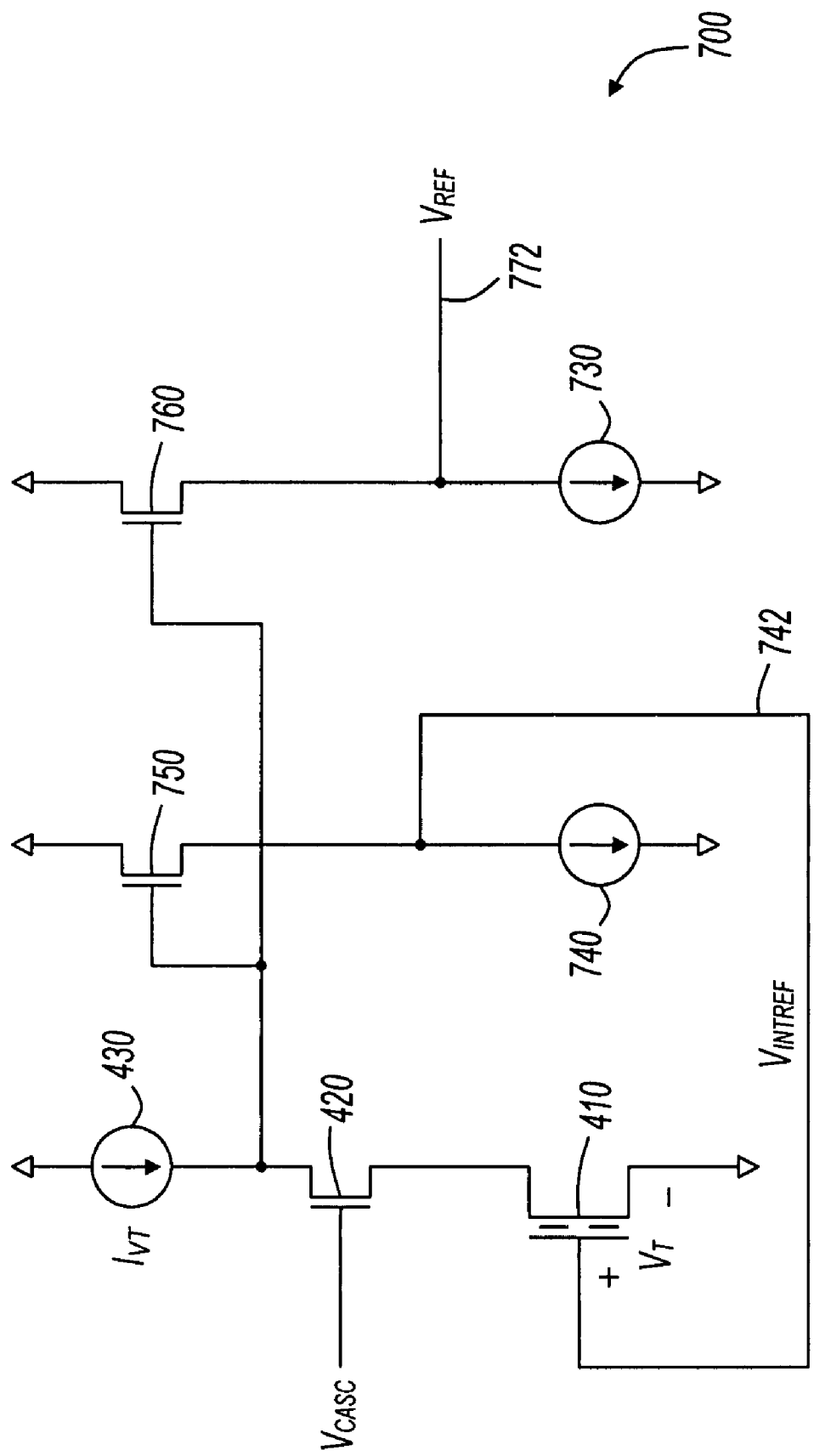

FIG. 7 shows a voltage reference circuit with an open loop output circuit. Voltage reference circuit 700 may be utilized within one or more reference voltage generators within a step voltage generator. For example, voltage reference circuit 700 may be included in reference voltage generator 110 in step voltage generator 100 (FIG. 1). Further, additional instantiations of voltage reference circuit 700 may be included in reference voltage generators 120 and 130 in step voltage generator 100.

Voltage reference circuit 700 includes flash cell 410, transistor 420, and current source 430, which are all described above with reference to FIG. 4. As described above, flash cell 410, transistor 420, and current source 430 together form an amplifier stage. Voltage reference circuit 700 also includes transistor 750 coupled in a source follower arrangement with current source 740 providing a drain-to-source current for transistor 750. The source follower circuit of transistor 750 and current source 740 are coupled to the first amplifier stage in a unity gain feedback configuration. In some embodiments, source follower transistor 750 is operated in the sub-threshold region.

The operation of voltage reference circuit 700 is similar to the operation of voltage reference circuit 600 (FIG. 6) except that transistors 750 and 760 of the source follower circuits are n-channel devices rather than p-channel devices and the sample and hold circuit is omitted. N-channel source-followers may be advantageously used to pull up the output node when the initial voltage is lower than the nominal voltage. With the gate voltage fixed, the initial gate-to-source voltage of the source follower transistor will be higher than its nominal value and it can pull up the output voltage very strongly to the nominal value.

The embodiments represented by FIG. 7 may be combined with embodiments represented by other figures without departing from the scope of the present invention. For example, voltage reference circuit 700 may include a voltage divider in the feedback path, may include a sample and hold circuit, or may not include a third stage.

Figure 8:
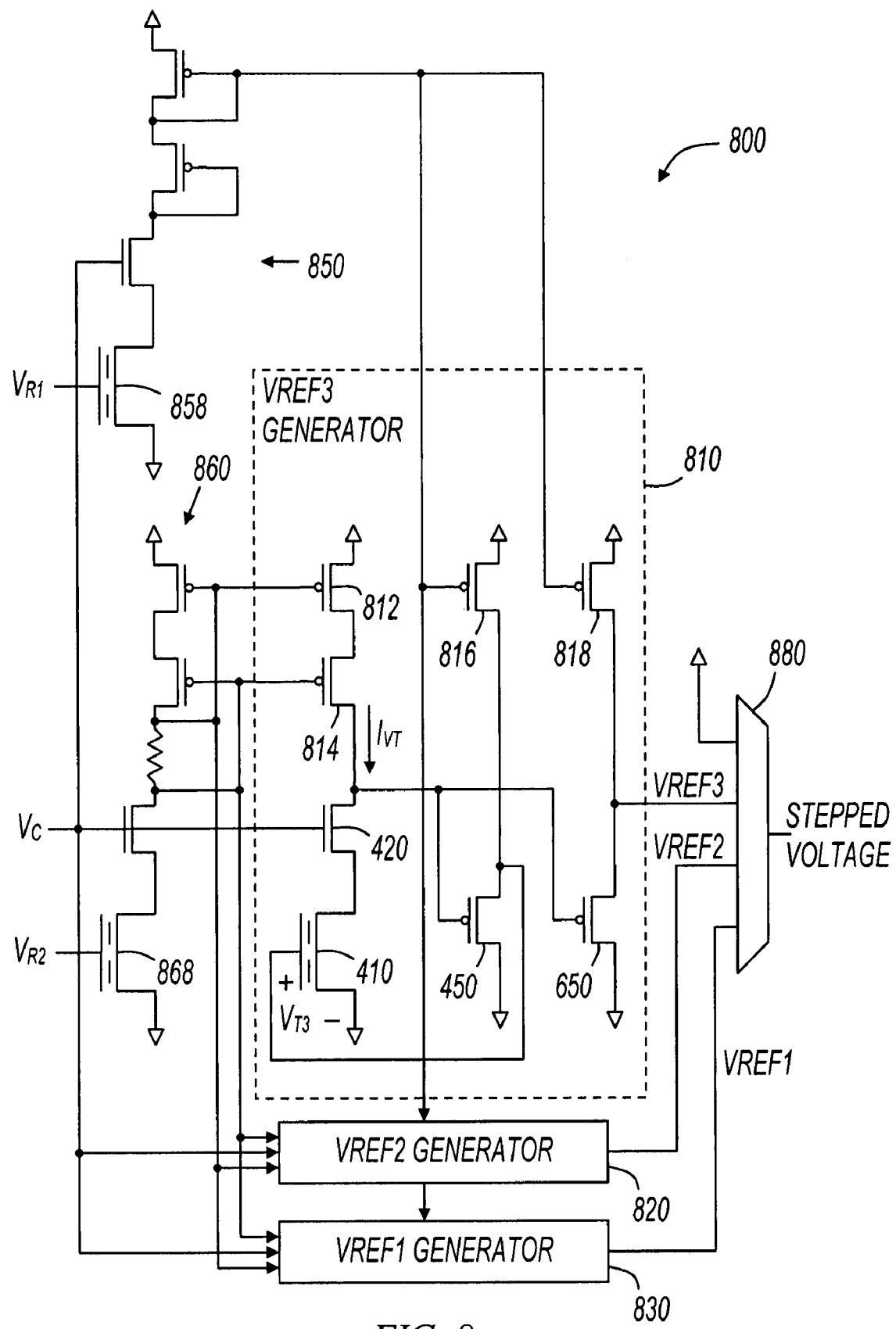
FIG. 8 shows a step voltage generator with shared reference current generators.

FIG. 8 shows a step voltage generator with shared reference current generators. Step voltage generator 800 includes reference voltage generators 810, 820, and 830, reference current generators 850 and 860, and multiplexer 880.

Reference voltage generator 810 includes flash cell 410 programmed to have a threshold voltage of $V_{T3}$. The threshold voltage of $V_{T3}$ corresponds to an output voltage of $V_{REF3}$. Likewise, reference voltage generator 820 includes a flash cell having a threshold voltage of $V_{T2}$ which corresponds to an output voltage of $V_{REF2}$, and reference voltage generator 830 includes a flash cell having a threshold voltage of $V_{T1}$ which corresponds to an output voltage of $V_{REF1}$. As described with reference to the previous figures, the flash cells may be individually programmed to trim the output voltages of the various reference voltage generators.

In some embodiments, reference voltage generators 820 and 830 are the same as reference voltage generator 810, with the exception that an internal flash cell has a different programmed threshold voltage. In other embodiments, reference voltage generators 820 and 830 include one or more features from other voltage reference circuits described herein. For example, in some embodiments, reference voltage generators 820 and 830 may include NMOS or PMOS source follower circuits, voltage dividers, sample and hold circuits, or any other variation. Any of reference voltage generators 810, 820 and 830 may include any of the various embodiments of voltage reference circuits described herein without departing from the scope of the present invention.

Step voltage generator 800 also includes two reference current generators: reference current generator 860 to provide a reference for the flash cell amplifier stages; and reference current generator 850 to provide a reference for the source-follower stages. Both reference current generators may make use of similar circuit topologies. For example, both reference current generators 850 and 860 generate reference currents using flash cells (858 and 868) having gates driven with reference voltages. Flash cells 858 and 868 are programmed to have threshold voltages equal to the reference voltages driving their respective gates. For example, flash cell 858 is programmed to have a threshold voltage of $V_{R1}$, and the gate of flash cell 858 is driven with a voltage of $V_{R1}$. Also for example, flash cell 868 is programmed to have a threshold voltage of $V_{R2}$, and the gate of flash cell 868 is driven with a voltage of $V_{R2}$. As shown in FIG. 8, flash cell 868 driven by $V_{R2}$ provides the reference current for the flash cell amplifier stages of the reference voltage generators, and flash cell 858 driven by $V_{R1}$ provides the reference current for the source follower stages. Though flash cells 858 and 868 are shown having different threshold voltages, in some embodiments, they may be the same, and similarly $V_{R1}$ and $V_{R2}$ may also be same.

Reference voltage generator 810 includes transistors 812 and 814, which mirror the reference current generated by reference current generator 860, and reference voltage generator 810 also includes transistors 816 and 818 which mirror the reference current generated in reference current generator 850. In some embodiments, reference voltage generators 820 and 830 also include transistors corresponding to transistors 812, 814, 816, and 818. In these embodiments, reference current generators 850 and 860 provide a common control voltage to current sources with reference voltage generators 810, 820, and 830, and the reference current generators are shared among the various reference voltage generators.

The reference voltages $V_{R1}$ and $V_{R2}$ may be generated in any manner. For example, reference voltages $V_{R1}$ and $V_{R2}$ may be generated using a bandgap voltage reference or any other type of voltage reference. In some embodiments, step voltage generator 800 is implemented as step voltage generator 200 (FIG. 2). For example, reference voltage generators 810, 820, and 830 may correspond to conditioning circuits 210, 220, and 230, and a voltage reference that generates $V_{R1}$ and $V_{R2}$ may correspond to voltage reference 205.

Figure 9:
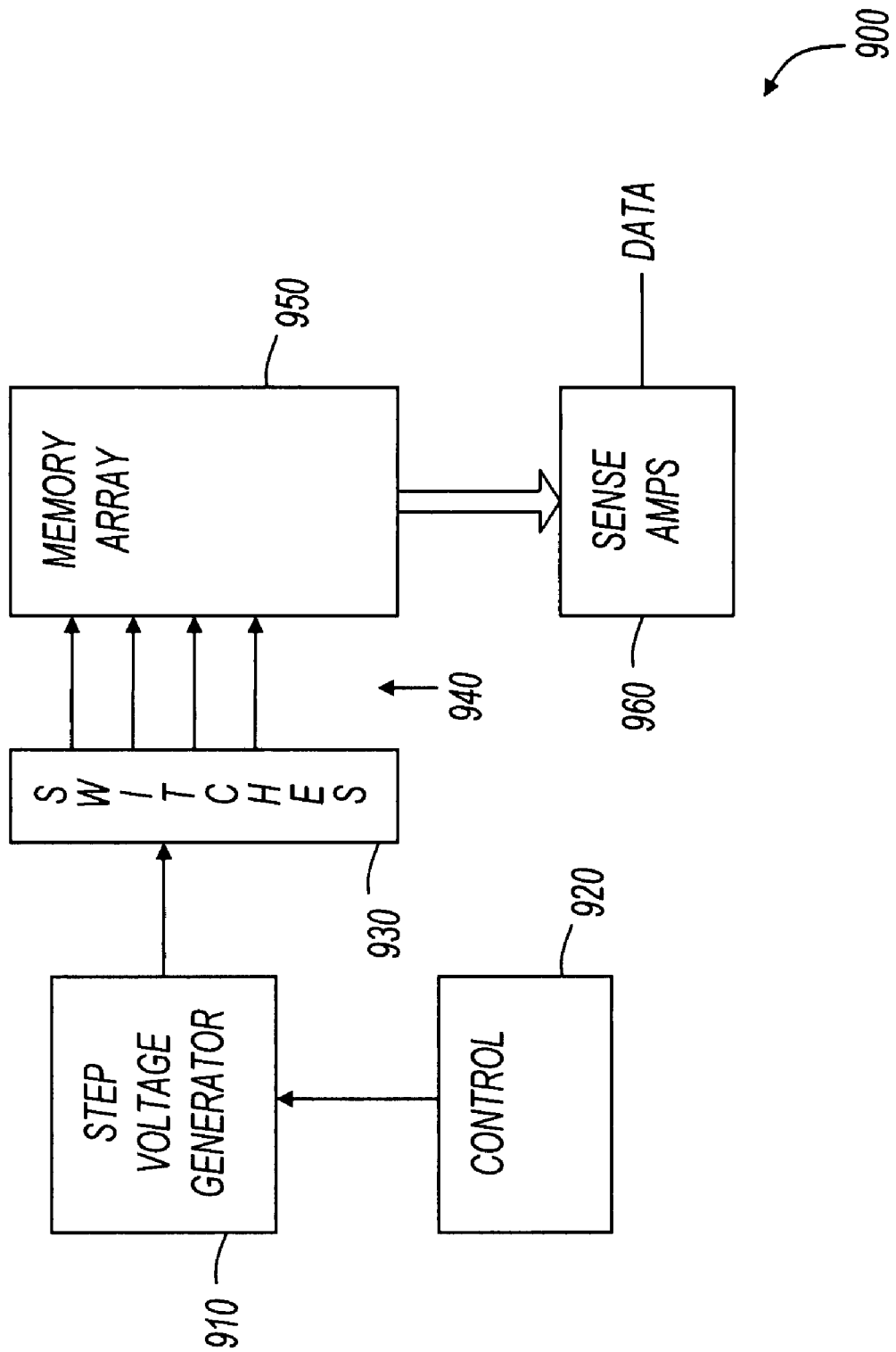
FIG. 9 shows a memory device.

FIG. 9 shows a memory device. Memory device 900 includes step voltage generator 910, control block 920, switches 930, memory array 950, and sense amplifiers 960. In some embodiments, memory array 950 is a multi-level cell (MLC) array wherein each flash cell may be programmed with one of a number of possible threshold voltages, where each possible threshold voltage represents more than one bit of information.

Step voltage generator 910 may be any step voltage generator embodiment described herein, including step voltage generator 100 (FIG. 1), step voltage generator 200 (FIG. 2), or step voltage generator 800 (FIG. 8). Step voltage generator 910 may produce a step-down voltage waveform such as waveform 300, a step-up waveform, or any other step waveform.

Switches 930 receive the stepped voltage waveform from step voltage generator 910 and provide the waveform on wordlines 940. In some embodiments, switches 930 include decoding circuitry to determine which of wordlines 940 should be driven with the stepped waveform. Memory device 900 is shown with four wordlines, but this is not a limitation of the present invention. Any number of wordlines may be present. Further, any number of step voltage generators may also be present.

In operation, control block 920 sequences step voltage generator through a stepped waveform, the appropriate wordlines are driven with the stepped waveform, and sense amplifiers 960 sense the output of memory array 950 at multiple locations in time as shown in FIG. 3.

In some embodiments, memory array 950 includes MLC flash cells, and step voltage generator 910 also includes flash cells as reference devices. In these embodiments, the reference voltage characteristics track the array cell characteristics.

For ease of illustration, portions of memory device 900 are not shown. Memory device 900 may include much more circuitry than illustrated in FIG. 9 without departing from the scope of the present invention.

Memory device 900 may be a packaged integrated circuit or an unpackaged integrated circuit die. For example, memory device 900 may be a packaged integrated circuit that includes an interface to allow it to be used as part of an electronic system. Also for example, memory device 900 may be included in a packaged integrated circuit that also includes other components, functional blocks, integrated circuit dice, or subsystems. Further, in some embodiments, memory device 900 may be sold as an unpackaged integrated circuit die.

FIG. 10 shows a flowchart in accordance with various embodiments of the present invention. In some embodiments, method 1000, or portions thereof, is performed by a manufacturer of a step voltage generator that includes trimmable voltage reference circuits, or by an automated testing machine capable of testing integrated circuits before or after they are packaged. In other embodiments, method 1000 is performed by a control circuit, an integrated circuit, or an electronic system. Method 1000 is not limited by the particular type of apparatus or software performing the method. The various actions in method 1000 may be performed in the order presented, or may be performed in a different order. Further, in some embodiments, some actions listed in FIG. 10 are omitted from method 1000.

Method 1000 is shown beginning with block 1010 in which threshold voltages of a plurality of floating gate transistors are modified. The floating gate transistors are in a plurality of voltage reference circuits, and modifying the threshold voltages affects the output voltages of the voltage reference circuits. The output voltages of the voltage reference circuits represent thresholds for multi-level cell flash memories. In some embodiments, the acts of block 1010 correspond to programming flash cell 410 in the various reference voltage generators, as shown in the previous figures. Also in some embodiments, the acts of block 1010 may correspond to utilizing a programming interface in an integrated circuit. For example, in some embodiments, control circuit 920 (FIG. 9) may include a programming interface to perform the acts of block 1010.

The acts of block 1010 may be performed by an integrated circuit manufacturer during wafer level test, or may be performed by a manufacturer after wafer level test. Further, the acts of block 1010 may be performed by a systems integrator or an end user. In some embodiments, the manufacturer may prevent any subsequent user from performing the acts of block 1010.

At 1020, the integrated circuit die that includes the reference voltage circuits is packaged. In some embodiments, this may correspond to the integrated circuit manufacturer packaging the integrated circuit die after performing the acts of block 1010. In other embodiments, this may correspond to the integrated circuit manufacturer packaging the integrated circuit die before performing the acts of block 1010.

In some embodiments, the actions of method 1000 may be performed by a person or an entity other than the integrated circuit manufacturer. For example, an integrated circuit die that includes a trimmable voltage reference may be sold to a party that will program the voltage reference and then package it, or package it and then program it.

Figure 11:
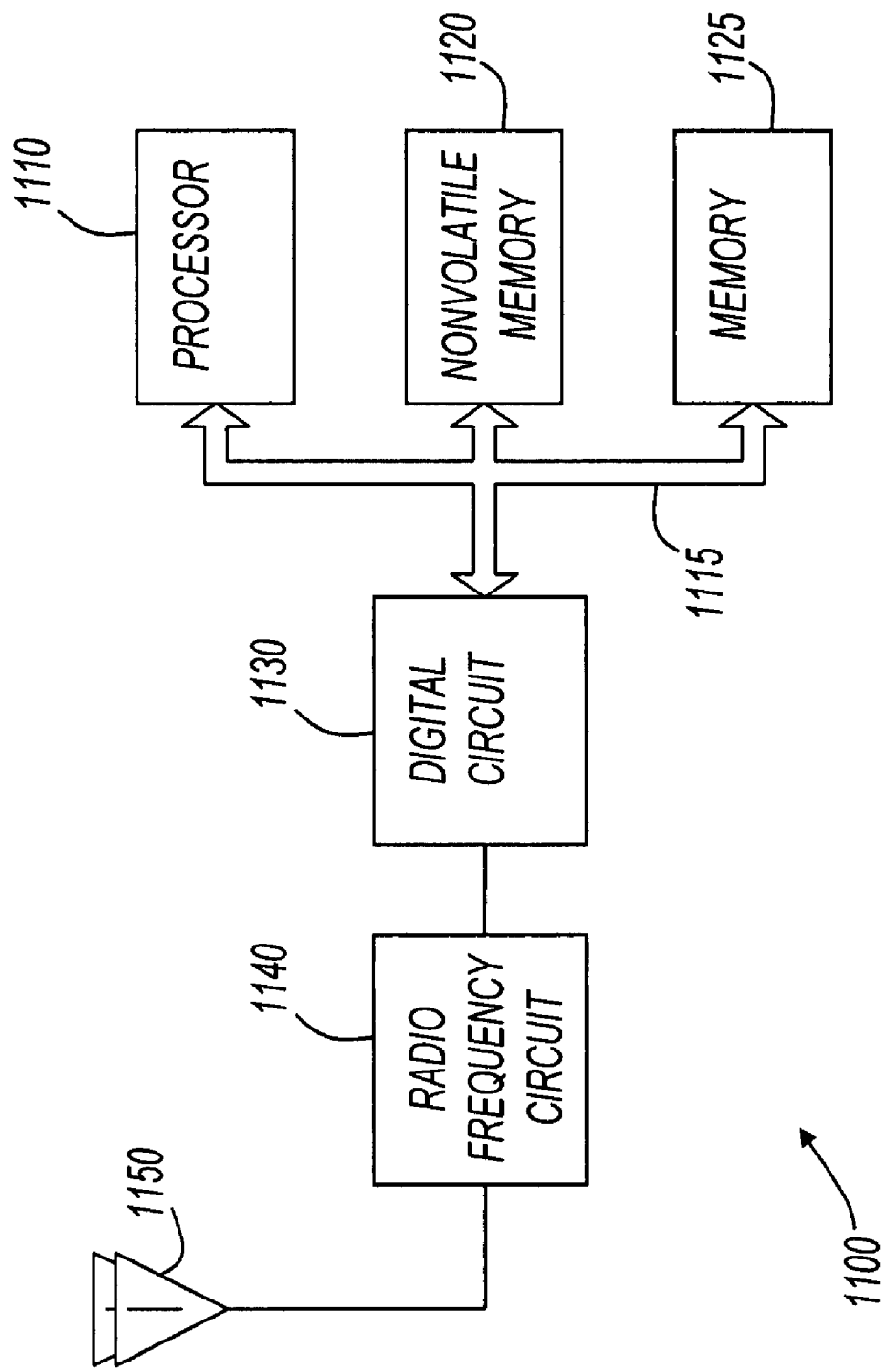
FIG. 11 shows an electronic system in accordance with various embodiments of the present invention.

FIG. 11 shows an electronic system in accordance with various embodiments of the present invention. Electronic system 1100 includes processor 1110, nonvolatile memory 1120, memory 1125, digital circuit 1130, radio frequency (RF) circuit 1140, and antennas 1150. Processor 1110 may be any type of processor adapted to access nonvolatile memory 1120 and memory 1125. For example, processor 1110 may be a microprocessor, a digital signal processor, a microcontroller, or the like.

Example systems represented by FIG. 11 include cellular phones, personal digital assistants, wireless local area network interfaces, or any other suitable system. Nonvolatile memory 1120 may be adapted to hold information for system 1100. For example, nonvolatile memory 1120 may hold device configuration data, such as contact information with phone numbers, or settings for digital circuit 1130 or RF circuit 1140. Further, nonvolatile memory 1120 may hold multimedia files such as photographs or music files. Still further, nonvolatile memory 1120 may hold program code to be executed by processor 1110. Nonvolatile memory 1120 may be any of the memory embodiments described herein, including memory device 900 (FIG. 9). Many other systems uses for nonvolatile memory 1120 exist. For example, nonvolatile memory 1120 may be used in a desktop computer, a network bridge or router, or any other system without an antenna.

Radio frequency circuit 1140 communicates with antennas 1150 and digital circuit 1130. In some embodiments, RF circuit 1140 includes a physical interface (PHY) corresponding to a communications protocol. For example, RF circuit 1140 may include modulators, demodulators, mixers, frequency synthesizers, low noise amplifiers, power amplifiers, and the like. In some embodiments, RF circuit 1140 may include a heterodyne receiver, and in other embodiments, RF circuit 1140 may include a direct conversion receiver. In some embodiments, RF circuit 1140 may include multiple receivers. For example, in embodiments with multiple antennas 1150, each antenna may be coupled to a corresponding receiver. In operation, RF circuit 1140 receives communications signals from antennas 1150, and provides signals to digital circuit 1130. Further, digital circuit 1130 may provide signals to RF circuit 1140, which operates on the signals and then transmits them to antennas 1150.

Digital circuit 1130 is coupled to communicate with processor 1110 and RF circuit 1140. In some embodiments, digital circuit 1130 includes circuitry to perform error detection/correction, interleaving, coding/decoding, or the like. Also in some embodiments, digital circuit 1130 may implement all or a portion of a media access control (MAC) layer of a communications protocol. In some embodiments, a MAC layer implementation may be distributed between processor 1110 and digital circuit 1130.

Radio frequency circuit 1140 may be adapted to receive and demodulate signals of various formats and at various frequencies. For example, RF circuit 1140 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The present invention is not limited in this regard.

Antennas 1150 may include one or more antennas. For example, antennas 1150 may include a single directional antenna or an omni-directional antenna. As used herein, the term omni-directional antenna refers to any antenna having a substantially uniform pattern in at least one plane. For example, in some embodiments, antennas 1150 may include a single omni-directional antenna such as a dipole antenna, or a quarter wave antenna. Also for example, in some embodiments, antennas 1150 may include a single directional antenna such as a parabolic dish antenna or a Yagi antenna. In still further embodiments, antennas 1150 may include multiple physical antennas. For example, in some embodiments, multiple antennas are utilized to support multiple-input-multiple-output (MIMO) processing or spatial-division multiple access (SDMA) processing.

Memory 1125 represents an article that includes a machine readable medium. For example, memory 1125 represents a random access memory (RAM), dynamic random access memory (DRAM), static random access memory (SRAM), read only memory (ROM), flash memory, or any other type of article that includes a medium readable by processor 1110. Memory 1125 may store instructions for performing the execution of the various method embodiments of the present invention.

In operation, processor 1110 reads instructions and data from either or both of nonvolatile memory 1120 and memory 1125 and performs actions in response thereto. For example, processor 1110 may access instructions from memory 1125 and program threshold voltages within reference voltage generators and reference current generators inside nonvolatile memory 1120. In some embodiments, nonvolatile memory 1120 and memory 1125 are combined into a single memory device. For example, nonvolatile memory 1120 and memory 1125 may both be included in a single nonvolatile memory device.

Although the various elements of system 1100 are shown separate in FIG. 11, embodiments exist that combine the circuitry of processor 1110, nonvolatile memory 1120, memory 1125 and digital circuit 1130 in a single integrated circuit. For example, memory 1125 or nonvolatile memory 1120 may be an internal memory within processor 1110 or may be a microprogram control store within processor 1110. In some embodiments, the various elements of system 1100 may be separately packaged and mounted on a common circuit board. In other embodiments, the various elements are separate integrated circuit dice packaged together, such as in a multi-chip module, and in still further embodiments, various elements are on the same integrated circuit die.

The type of interconnection between processor 1110 and nonvolatile memory 1120 is not a limitation of the present invention. For example, bus 1115 may be a serial interface, a test interface, a parallel interface, or any other type of interface capable of transferring command and status information between processor 1110, nonvolatile memory 1120, and memory 1125.

Step voltage generators, voltage references, flash cells, feedback circuits, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, flash cell 410 (FIGS. 4-8) can be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A multi-level cell flash memory device comprising:
   an array of flash memory cells, the array of flash memory cells having wordlines coupled thereto; and
   at least one step voltage generator coupled to the wordlines, wherein the at least one step voltage generator includes a voltage reference, a plurality of conditioning circuits coupled to receive a reference voltage from the voltage reference, and a multiplexer coupled to receive reference voltages from the plurality of conditioning circuits wherein each of the plurality of conditioning circuits includes an amplifier and a feedback network.

2. The multi-level cell flash memory device of claim 1 further comprising a control circuit coupled to the multiplexer to step through the reference voltages from the plurality of conditioning circuits.

3. A multi-level cell flash memory device comprising:
   an array of flash memory cells, the array of flash memory cells having wordlines coupled thereto; and
   at least one step voltage generator coupled to the wordlines, wherein the at least one step voltage generator includes a plurality of reference voltage generators and a multiplexer, and wherein each of the plurality of reference voltage generators includes a floating gate transistor having a programmable threshold voltage, and a feedback circuit to produce a reference voltage that depends on the programmable threshold voltage.

4. The multi-level cell flash memory device of claim 3 wherein each of the plurality of reference voltage generators further comprises a current source to provide a threshold voltage current to the floating gate transistor.

5. The multi-level cell flash memory device of claim 4 wherein the feedback circuit comprises a source follower circuit.

6. The multi-level cell flash memory device of claim 5 wherein the source follower circuit comprises an isolated gate transistor having:
   a gate node to receive a voltage from the floating gate transistor;
   a drain node coupled to a power supply node; and
   a source node coupled to a gate node of the floating gate transistor.

7. The multi-level cell flash memory device of claim 4 wherein the at least one step voltage generator further comprises a reference current generator to provide a common voltage to control the current sources that provide threshold voltage currents to the floating gate transistors.

8. A multi-level cell flash memory device comprising:
   an array of flash memory cells, the array of flash memory cells having wordlines coupled thereto; and at least one step voltage generator coupled to the wordlines, wherein the at least one step voltage generator includes a plurality of reference voltage generators, each reference voltage generator including a transistor with a programmable threshold voltage and a feedback circuit, to generate reference voltages that vary based on programmed threshold voltages of the transistors and a multiplexing circuit to multiplex the reference voltages onto the wordlines.

9. The multi-level cell flash memory device of claim 8 wherein the transistor with a programmable threshold voltage comprises a floating gate transistor.

10. The multi-level cell flash memory device of claim 8 wherein each of the plurality of reference voltage generators comprises:
   a first stage including the transistor with a programmable threshold voltage; and
   a second stage coupled in a feedback arrangement with the first stage to provide a reference voltage that varies with the programmable threshold voltage.

11. The multi-level cell flash memory device of claim 10 wherein the second stage includes a source follower circuit.

12. The multi-level cell flash memory device of claim 11 wherein the source follower circuit includes an isolated gate transistor, and the second stage further includes a current source to bias the isolated gate transistor in a sub-threshold region of operation.

13. The multi-level cell flash memory device of claim 10 wherein the first stage further includes a current source to provide a current substantially equal to a threshold voltage current of the transistor.

14. The multi-level cell flash memory device of claim 13 further comprising a reference current generator to provide a common control voltage to the current sources within the first stages of the plurality of reference voltage generators.

15. The multi-level cell flash memory device of claim 13 wherein the first stage further includes a cascode transistor coupled between the current source and the transistor with a programmable threshold voltage.

16. The multi-level cell flash memory device of claim 10 wherein each of the plurality of reference voltage generators comprises a third stage coupled to provide an open loop output response.

17. The multi-level cell flash memory device of claim 16 wherein the second and third stages of each of the plurality of reference voltage generators include matched source follower circuits and current sources to produce an output voltage related to the reference voltage.

18. The multi-level cell flash memory device of claim 17 further comprising a reference current generator to provide a common control voltage to each of the current sources within the second and third stages of the plurality of reference voltage generators.

19. The multi-level cell flash memory device of claim 8 further comprising a control circuit to sequence the reference voltages on the wordlines to form stepped voltage waveforms.

20. The multi-level cell flash memory device of claim 19 wherein the stepped voltage waveforms comprise a step-up waveform.

21. The multi-level cell flash memory device of claim 19 wherein the stepped voltage waveforms comprise a step-down waveform.

22. The multi-level cell flash memory device of claim 19 wherein the stepped voltage waveforms comprise an arbitrary stepped waveform.

* * * * *

UNITED STATES PATENT AND TRADEMARK OFFICE
CERTIFICATE OF CORRECTION

PATENT NO. : 7,313,019 B2
APPLICATION NO. : 11/018130
DATED : December 25, 2007
INVENTOR(S) : Giduturi et al.

It is certified that error appears in the above-identified patent and that said Letters Patent is hereby corrected as shown below:

Title page, Item (57), under "Abstract", in column 2, line 1, delete "trainable" and insert -- trimmable --, therefor.

Signed and Sealed this

Twentieth Day of May, 2008

JON W. DUDAS
*Director of the United States Patent and Trademark Office*